(12) United States Patent
Tung et al.

(10) Patent No.: US 8,421,179 B2
(45) Date of Patent: Apr. 16, 2013

(54) SCHOTTKY DIODE WITH HIGH ANTISTATIC CAPABILITY

(75) Inventors: Chiun-Yen Tung, Kaohsiung (TW); Kun-Hsien Chen, Kaohsiung (TW); Kai-Ying Wang, Kaohsiung (TW); Wen-Li Tsai, Kaohsiung (TW)

(73) Assignee: Pynmax Technology Co., Ltd., Kaohsiung (TW)

( * ) Notice: Subject to any disclaimer, the term of this patent is extended or adjusted under 35 U.S.C. 154(b) by 105 days.

(21) Appl. No.: 13/186,494

(22) Filed: Jul. 20, 2011

(65) Prior Publication Data
US 2012/0205770 A1 Aug. 16, 2012

(30) Foreign Application Priority Data
Feb. 11, 2011 (TW) .............................. 100202614 U

(51) Int. Cl.
*H01L 29/872* (2006.01)
(52) U.S. Cl.
USPC .................................. 257/475; 257/E29.338

(58) Field of Classification Search ................... 257/751, 257/471, E29.338
See application file for complete search history.

(56) References Cited

U.S. PATENT DOCUMENTS

| | | | | |
|---|---|---|---|---|
| 6,975,013 B2 * | 12/2005 | Fujihira et al. | ................. | 257/471 |
| 7,276,771 B2 * | 10/2007 | Fujihira et al. | ................. | 257/471 |
| 8,232,558 B2 * | 7/2012 | Zhang et al. | .................... | 257/77 |

* cited by examiner

*Primary Examiner* — Roy Potter
(74) *Attorney, Agent, or Firm* — Patenttm.us

(57) ABSTRACT

A Schottky diode with high antistatic capability has an N− type doped drift layer formed on an N+ type doped layer. The N− type doped drift layer has a surface formed with a protection ring. Inside the protection ring is a P-type doped area. The N− type doped drift layer surface is further formed with an oxide layer and a metal layer. The contact region between the metal layer and the N− type doped drift layer and the P-type doped area forms a Schottky contact. The P-type doped area has a low-concentration lower layer and a high-concentration upper layer, so that the surface ion concentration is high in the P-type doped area. The Schottky diode thus has such advantages of lowered forward voltage drop and high antistatic capability.

6 Claims, 4 Drawing Sheets

SCHOTTKY DIODE WITH HIGH ANTISTATIC CAPABILITY

BACKGROUND OF THE INVENTION

1. Field of the Invention

The invention relates to a Schottky diode and, in particular, to a Schottky diode with high antistatic capability.

2. Description of Related Art

Schottky diode is a diode with lower forward voltage drop and allows high-speed switches. A metal-semiconductor junction is used as a Schottky barrier for current rectification, different from the P-N junction of normal diodes that are purely formed between semiconductors. The characteristics of a Schottky barrier lower the forward voltage drop of the Schottky diode, and increase the switching speed.

With reference to FIG. 3, the Schottky diode mainly has an N– type doped drift layer 81 formed on an N+ type doped layer 80. The N– type doped drift layer 81 is formed with an embedded protection ring 82 in which a P-type doped area is formed. The surface of the N– type doped drift layer 81 is further formed with an oxide layer 83 and a metal layer 84. The contact region between the metal layer 84 and the N– type doped drift layer 81 and the P-type doped area forms a Schottky barrier 85. Moreover, the bottom surface of the N+ type doped layer 80 is formed with a metal layer as a bottom electrode 86.

In the above-mentioned structure, free electrons in the N– type doped drift layer 81 have a lower energy level than those in the metal layer 84. Without a bias, the electrons in the N– type doped drift layer 81 cannot move to the metal layer 84. When a forward bias is imposed, the free electrons in the N– type doped drift layer 81 have sufficient energy to move to the metal layer 84, thereby producing an electric current. Since the metal layer 84 does not have minor carriers, electric charges cannot be stored. Therefore, the reverse restoring time is very short. According to the above description, the Schottky diode uses the junction between the metal and the semiconductor as the Schottky barrier for current rectification. It is different from the PN junction formed by semiconductor/semiconductor junction in normal diodes. The characteristics of the Schottky barrier render a lower forward voltage drop for the Schottky diode. The voltage drop of normal PN junction diodes is 0.7-1.7 volts. The voltage drop of the Schottky diode is 0.15-0.45 volts. The characteristics of the Schottky barrier also increase the switching speed.

With reference to FIG. 4, the characteristic curve of the Schottky diode shows the relation between the forward voltage V and the current I and relationship between the reverse breakdown voltage and the current I. The characteristic curve indicates that as the current I becomes larger, the forward voltage V also becomes higher. The rise in the forward voltage definitely affects the characteristics and applications of the Schottky diode. On the other hand, to prevent electronic products from being damaged by electrostatics, whether the Schottky diode has high antistatic capability is an important issue.

SUMMARY OF THE INVENTION

An objective of the invention is to provide a Schottky diode that has high antistatic capability and lowers the forward voltage drop. By modifying the structure of the Schottky diode, the Schottky diode increases its antistatic capability and lowers its forward voltage.

The Schottky diode with high antistatic capability has an N– type doped drift layer formed on an N+ type doped layer. The N– type doped drift layer has a surface formed with a protection ring. Inside the protection ring is a P-type doped area. The N– type doped drift layer surface is further formed with an oxide layer and a metal layer. The contact region between the metal layer and the N– type doped drift layer and the P-type doped area forms a Schottky contact. The P-type doped area has a low-concentration lower layer and a high-concentration upper layer.

Since the P-type doped area is composed of the low-concentration lower layer and the high-concentration upper layer, the surface ion concentration of the P-type doped area is increased, good for injection of a large amount of ions. This can increase the antistatic capability of the Schottky diode. Further, the forward voltage drop of the Schottky diode can be reduced, and the reverse breakdown voltage of the Schottky diode can be increased.

DETAILED DESCRIPTION OF THE PREFERRED EMBODIMENT

Figure 1:
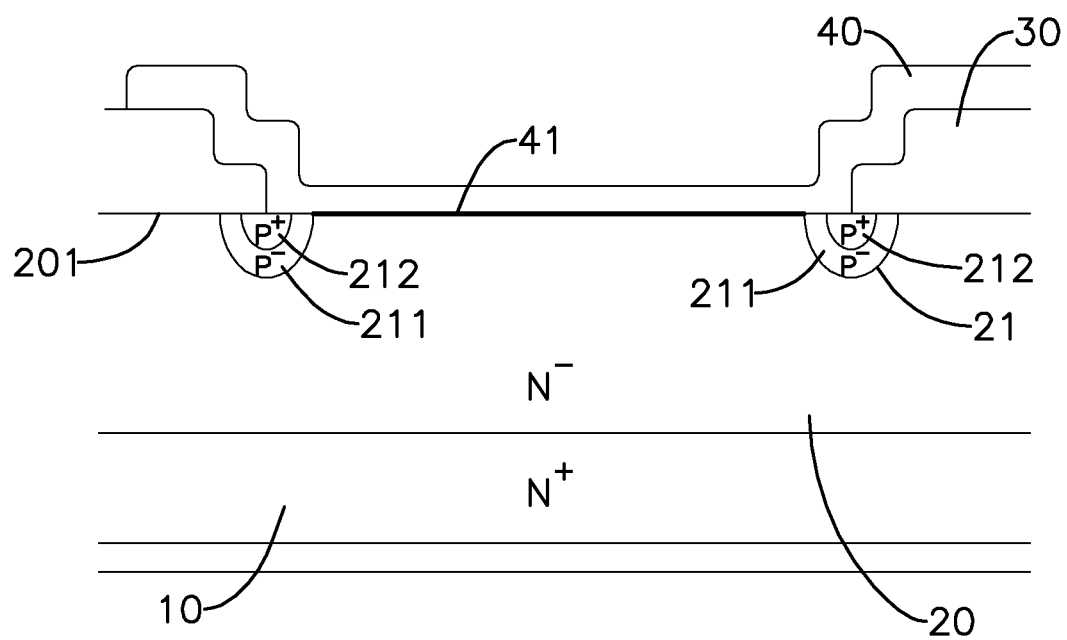
FIG. 1 is a schematic view of a first embodiment of the Schottky diode in accordance with the present invention.

With reference to FIG. 1, a first preferred embodiment of the invention comprises an N+ type doped layer 10 formed with an N– type doped drift layer 20 that has a surface 201 with an embedded protection ring 21. An area enclosed by the protection ring 21 is an active area. Inside the protection ring 21 is a P-type doped area. The surface 201 of the N– type doped drift layer 20 is further formed with an oxide layer 30, which partially covers and contacts the P-type doped area inside the protection ring 21. Moreover, a metal layer 40 is formed on the N– type doped drift layer 20 and the oxide layer 30. The contact region between the metal layer 40 and the N– type doped drift layer 20 within the protection ring 21 forms a Schottky barrier 41.

It should be noted that the P-type doped area of the protection ring 21 comprises a low-concentration lower layer 211 and a high-concentration upper layer 212. During ion implantation, the doped layer near the bottom of the protection ring 21 has a low dope concentration, forming the low-concentration lower layer 211. The doped layer near the top of the protection ring 21 has a high dope concentration, forming the high-concentration upper layer 212. In this embodiment, the low-concentration lower layer 211 has roughly a U shape and covers the outer side of the high-concentration upper layer 212. Therefore, in addition to the up and down relation in space, the high-concentration upper layer 212 and the low-concentration lower layer 211 also have the inside-outside relation. The surfaces of the high-concentration upper layer 212 and the low-concentration lower layer 211 are both exposed from the surface of the N– type doped drift layer 20. With this structure, the surface ion concentration of the P-type doped area is high, facilitating the injection of a large amount of carriers.

Figure 2:
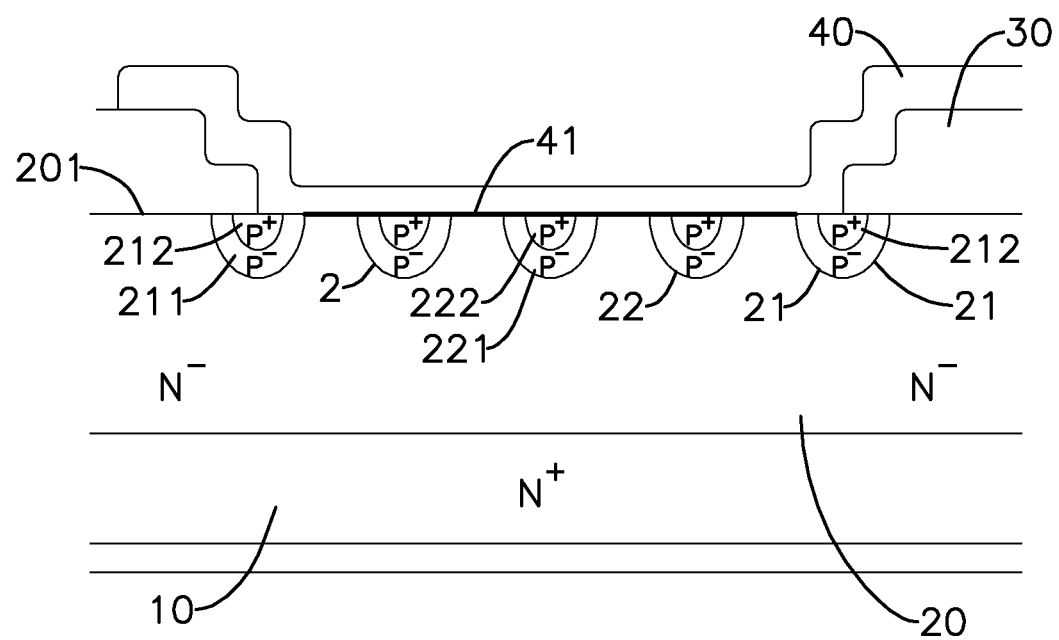
FIG. 2 is a schematic view of a second embodiment of the Schottky diode in accordance with the present invention.
Figure 3:
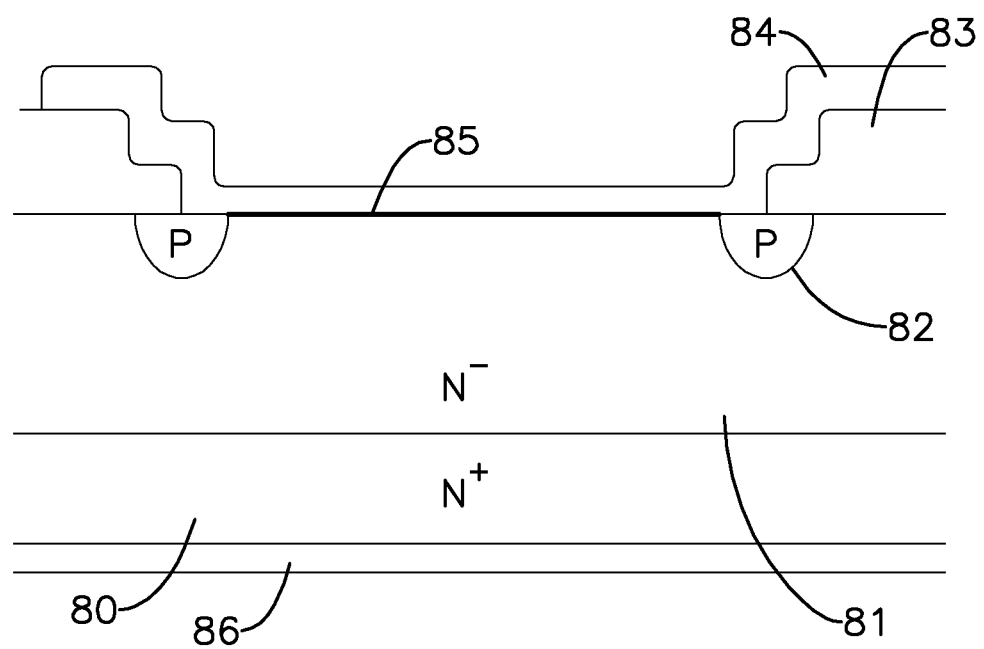
FIG. 3 shows the structure of a conventional Schottky diode.
Figure 4:
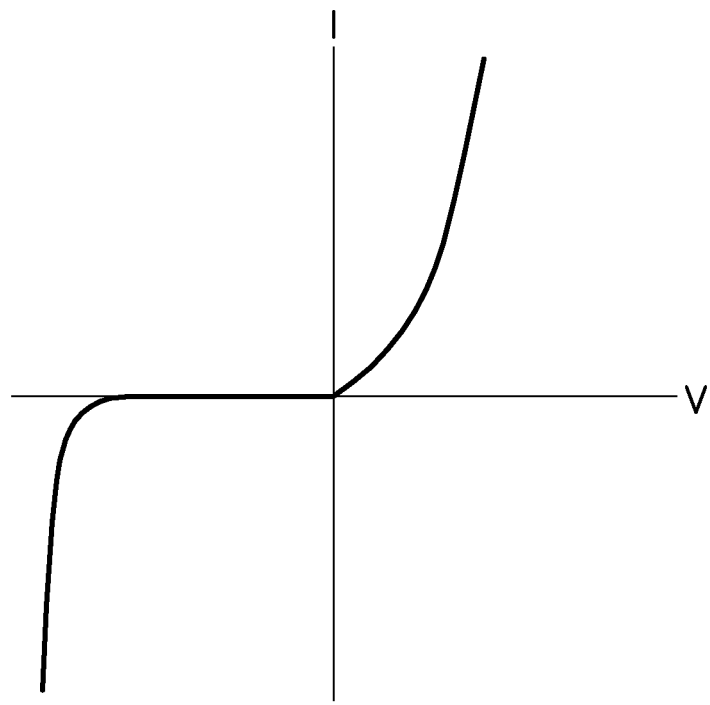
FIG. 4 shows a characteristic curve of a conventional Schottky diode.

With reference to FIG. 2, a second embodiment of the invention is basically the same as the first embodiment. The difference is in that the active area of the N– type doped drift layer 20 is formed with a plurality of second P-type doped areas 22, each of which is the same as the above-mentioned P-type doped area and has a low-concentration lower layer 221 and a high-concentration upper layer 222. Adding second P-type doped areas 22 in the active area increases the PN junctions and the reverse breakdown voltage. The second P-type doped areas 22 having a low-concentration lower layer 221 and a high-concentration upper layer 222 can increase the surface ion concentration, good for the injection of major carriers. This not only increases the antistatic capability, but also lowers the forward voltage drop.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A Schottky diode with high antistatic capability comprising:
an N+ type doped layer;
an N− type doped drift layer formed on the N+ type doped layer and having a surface formed with an embedded protection ring in which a P-type doped area having a low-concentration lower layer and a high-concentration upper layer is formed;
an oxide layer formed on the N− type doped drift layer; and
a metal layer formed on the oxide layer and the N− type doped drift layer, a contact region between the metal layer and the N− type doped drift layer within the protection ring forming a Schottky barrier.

2. The Schottky diode as claimed in claim 1, wherein the low-concentration lower layer of the P-type doped area has a U shape and covers an outer side of the high-concentration upper layer, and surfaces of the low-concentration lower layer and the high-concentration upper layer are exposed from the surface of the N− type doped drift layer.

3. The Schottky diode as claimed in claim 1, wherein an area enclosed by the protection ring on the N− type doped drift layer is an active area formed with a plurality of second P-type doped areas, and each of the second P-type doped areas has a low-concentration lower layer and a high-concentration upper layer.

4. The Schottky diode as claimed in claim 2, wherein an area enclosed by the protection ring on the N− type doped drift layer is an active area formed with a plurality of second P-type doped areas, and each of the second P-type doped areas has a low-concentration lower layer and a high-concentration upper layer.

5. The Schottky diode as claimed in claim 3, wherein the low-concentration lower layer of each of the second P-type doped areas has a U shape and covers an outer side of the high-concentration upper layer, and surfaces of the low-concentration lower layer and the high-concentration upper layer are exposed from the surface of the N− type doped drift layer.

6. The Schottky diode as claimed in claim 4, wherein the low-concentration lower layer of each of the second P-type doped areas has a U shape and covers an outer side of the high-concentration upper layer, and surfaces of the low-concentration lower layer and the high-concentration upper layer are exposed from the surface of the N− type doped drift layer.

\* \* \* \* \*